Sept. 18, 1962 R. BOWERS ETAL 3,054,842

THERMOELECTRIC COMPOSITION

Filed March 17, 1960

WITNESSES

John C. Healey, Jr.

Charles L. Menzemer

INVENTORS
Raymond Bowers &
Roland W. Ure, Jr.
BY
Frederick Shapoe
ATTORNEY

United States Patent Office 3,054,842

Patented Sept. 18, 1962

3,054,842

THERMOELECTRIC COMPOSITION

Raymond Bowers, Pittsburgh, and Roland W. Ure, Jr., Monroeville, Pa., assignors to Westinghouse Electric Corporation, East Pittsburgh, Pa., a corporation of Pennsylvania Filed Mar. 17, 1960, Ser. No. 15,600
7 Claims. (Cl. 136—5)

Figure 1:
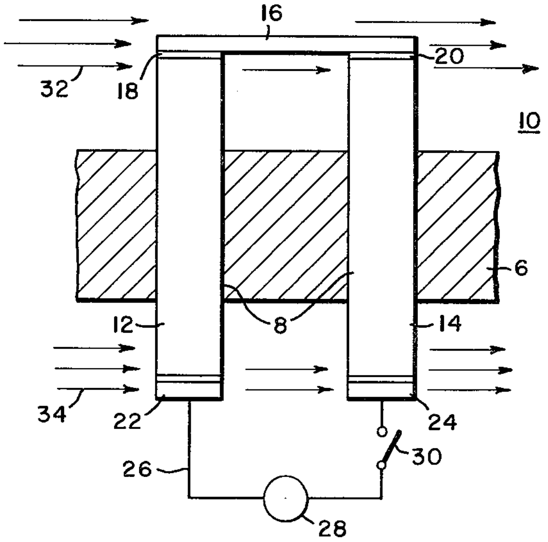

The present invention relates to a new and novel thermoelectric material.

It has been regarded as highly desirable to produce thermoelectric devices wherein either an electric current is passed therethrough to effect cooling at one junction or, alternatively, a source of heat is applied to one junction of the thermoelectric device to bring this junction to a given elevated tempertaure, while the other junction of the device is kept at a low temperature, whereby an electrical voltage is generated in the device. For refrigeration or cooling applications in particular, one junction of the thermoelectric device is disposed within an insulated chamber and an electrical current is passed through the junction in such a direction that the junction within the chamber becomes cooler while the other junction of the thermoelectric device is disposed externally of the chamber and dissipates heat to a suitable heat sink such as the atmosphere, cooling water or the like.

When heat is applied to one junction of a thermoelectric device while the other junction is cooled, an electrical potential is produced proportional to the Seebeck coefficient of the thermal elements employed, and to the temperature difference between the junctions. Accordingly, it is desirable that the thermal elements be made of such material that, all other factors being equal, the highest potential is developed for a given temperature difference between the hot and cold junctions. The electrical resistivity of the thermal element member of the device and the thermal conductivity both should be as low as possible in order to reduce electrical losses and thermal losses.

The efficiency of a thermoelectric device, for example, a power generator, is closely related to the figure of merit of the thermoelectric materials employed. The higher the figure of merit of the materials the better the efficiency. The figure of merit of a thermoelectric material is defined as:

$$Z=\frac{\alpha^2}{\rho K}$$

wherein:

$\alpha$=Seebeck coefficient in volt/degree C.
$\rho$=electrical resistivity in ohm-cm.
$K$=thermal conductivity in watt/cm. degree C.

An object of the present invention is to provide a chemically reacted composition having the formula $A_xB_{2-x}C_2$ wherein, A is at least one element selected from the group consisting of cadmium, zinc and mercury;
B is at least one element selected from the group consisting of tin, germanium, and silicon; and
C is at least one element selected from the group consisting of arsenic, antimony and phosphorus, and
$x$ may vary from 0.5 to 1.5. Particularly satisfactory materials are those in which $x$ varies from 1 to 1.2.

Another object of the present invention is to provide a thermoelectric device comprising a thermoelectric element at least a portion of which is comprised of a chemically reacted composition having the formula $A_xB_{2-x}C_2$ wherein A, B, and $x$ have the meanings set forth above.

Other objects will, in part, appear hereinafter and will, in part, be obvious.

Figure 2:
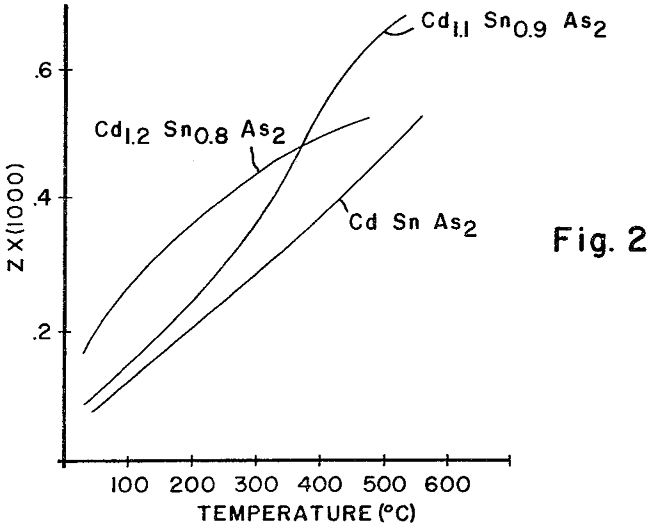

For a better understanding of the nature and objects of the invention, reference should be had to the following description and drawings, in which:

FIGURE 1 is a side view, partially in cross-section, of a thermoelectric device; and FIG. 2 is a graph plotting the figure of merit (Z) versus temperature for three different thermoelectric compositions of this invention.

In accordance with the present invention and attainment of the foregoing objects, there is provided a thermoelectric device comprising at least one thermoelectric element comprised of a chemically reacted composition having the formula $A_xB_{2-x}C_2$, wherein A is at least one element selected from the group consisting of cadmium, zinc and mercury;
B is at least one element selected from the group consisting of tin, germanium and silicon; and
C is at least one element selected from the group consisting of arsenic, antimony and phosphorus, and
$x$ may vary from 0.5 to 1.5.

The semiconductor composition of this invention is formed into a solid body either by casting or by pressing a powder. The compositions are usually employed in a polycrystalline state which is the most easily achieved. However, single crystals may be prepared and are suitable for use in thermoelectric devices.

The thermoelectric compositions of this invention are most efficient when operated in a temperature range of from approximately 200° C. to 600° C.

One particular advantage of the thermoelectric compositions of the present invention is that the thermoelectric characteristic is negative (n-type). These materials are opposite in sign to many of the other known thermoelectric materials having a high figure of merit. Consequently, the compositions of the present invention provide a desirable complement to those known positive (p-type) thermoelectric materials. For many purposes, a metal, such as copper and 18–8 stainless steel, may form the other element of the thermoelectric pair in which one element has the composition set forth herein. Also metallic, semimetallic and non-metallic compounds may be employed, for example zinc antimonide in stoichiometric proportions, and p-type lead telluride.

One convenient method of preparing the chemically reacted composition of this invention suitable for use as an n-type thermoelectric material comprises admixing predetermined proportions of at least one element selected from the group consisting of cadmium, zinc, mercury, with at least one element selected from the group consisting of tin, germanium, and silicon and at least one element selected from the group consisting of arsenic, antimony, and phosphorus, to form a composition having the formula $A_xB_{2-x}C_2$, wherein $x$ has a value of from 0.5 to 1.5. The mixture is then charged into a suitable vessel of quartz or other inert material that will not react with a melt thereof. The vessel is then evacuated and sealed off under a vacuum, for example, a vacuum having an absolute pressure of $10^{-2}$ mm. Hg.

The sealed vessel is then lowered through a two zone vertical furnace. The first or top zone of the furnace is maintained at a temperature above the melting point of the components and the resultant composition, for example, a temperature of about 630° C. The second or bottom zone of the furnace is maintained at a temperature below the melting point of the resulting composition for example a temperature of about 580° C. Satisfactory results have been realized using a furnace in which the two zones of the furnace are each approximately 12 inches long and when the sealed vessel is lowered at a rate of approximately 1 to 4 inches per hour. The vessel is then allowed to cool to room temperature.

Depending upon the purity of the starting materials and the desired purity of the material produced therefrom, it may be necessary to zone refine the composition. If zone refining is required, the solidified material, still in the sealed quartz vessel, is placed in an elongated boat comprised of graphite or any other suitable refractory material and zone refined. From 1 to 10 zone refining passes have been found adequate to insure a suitably pure material. However, it will be appreciated, depending upon the purity of the initial starting materials used, more zone passes may be required. The extremities, approximately 0.5 to 2 centimeters, of the zone refined body, which contain any impurity segregated as a result of the zone refining, are cut away from the solidified mass. The remainder of the material thus produced is suitable for use in accordance with the teachings of this invention. However, in many instances the composition is pure enough so as to require no zone refining.

Referring to FIG. 1 of the drawing, there is illustrated a thermoelectric device suitable for generating electrical current by passing a hot gas or other source of heat over one junction thereof. An electrically insulating barrier 6 is provided with aperatures 8 therein through which are disposed the elements of the thermoelectric device. In FIG. 1 there is illustrated a single thermoelectric device 10. The device 10 comprises a positive thermoelectric element member 12, such as a bar of semi-metal, for example, zinc antimonide, and a negative element 14 comprised of pellets of the composition of this invention.

An electrically conducting strip 16 of a metal, for example, copper, silver and the like is jointed to an end face 18 of the member 12 and an end face 20 of member 14 within the chamber formed by the barrier 6 so as to provide good electrical and thermal contact therewith. The end faces 18 and 20 may be coated with a thin layer of metal, for example, by vapor evaporation or by use of ultrasonic brazing, whereby good electrical contact and thermal adherence thereto is obtained. A metal strip 16 of copper, silver, or the like, may be brazed or soldered to the metal coated end faces 18 and 20. The metal strip 16 may be provided with suitable fins or other means for conducting heat thereto from the chamber in which it is disposed.

At the end of member 12 located on the outer side of barrier walls 6 is attached a metal plate or strip 22 by brazing or soldering in the same manner as was employed in attaching strips 16 to the end face 18. Similarly, a metal strip or plate 24 may be connected to the other end of member 14. The plates 22 and 24 may be provided with heat dissipating fins or other cooling means whereby heat generated thereat may be dissipated. An electrical conductor 26 is affixed to the end plates 22 and 24 and connected to a work load 28. A switch 30 is interposed in the conductor 26 to enable the electrical current to be broken or closed as desired.

In operation a hot gas or other fluid flowing as indicated by the arrows 32 heats the strip 16. Cooling means such as a stream of water or cold air, as indicated by arrows 34, flows over the strips 22 and 24 thereby maintaining these portions at a lower temperature than the portions 18 and 20. A direct electrical current is thereby generated proportional to the temperature difference. It will be appreciated that a plurality of pairs of thermoelectric elements may be joined in series, if desired, in order to produce a high potential or voltage. Consequently, direct current of any suitable voltage may be generated by connecting in series any number of paired elements.

While the thermoelectric element 14 has been shown to be comprised entirely of a material having the composition $A_xB_{2-x}C_2$, it will be understood that the $$A_xB_{2-x}C_2$$

material may comprise only a portion of the element, the remainder being comprised of one or more materials of the same thermoelectric sign. These materials may be joined end to end to form a composite pellet or joined to each other through metal end plates to form a single element.

In order to illustrate the invention more fully, the following examples are given:

*Example I*

To prepare an n-type thermoelectric composition having the formula $Cd_{1.1}Sn_{0.9}As_2$, 12.32 grams of cadmium, 10.6 grams of tin and 14.8 grams of arsenic, all highly purified, were charged into a quartz bulb one-half inch in diameter and 7 inches long. The bulb was evacuated and sealed off. The bulb was then lowered at a rate of 1 inch per hour through a 12 inch long top zone of a two-zone vertical furnace. The top zone was at a temperature of 630° C. After passing through the top zone, the bulb was passed through a 12 inch long bottom zone of the furnace at a rate of 1 inch per hour. The bottom zone was at a temperature of 580° C.

The solidified composition was then allowed to cool slowly to room temperature.

The cast bar of $Cd_{1.1}Sn_{0.9}As_2$ material thus produced had a diameter of one-half inch and a length of three inches.

A series of test wafers were cut from the body and tested to determine the various properties relevant to the thermoelectric characteristics of the material. The figure of merit (Z) was determined from measurements over a temperature range of approximately 100° C. to 600° C. using the equation:

$$Z=\frac{\alpha^2}{\rho K}$$

wherein:

$\alpha$=Seebeck coefficient (volts/1° C.)
$\rho$=electrical resistivity (ohm-cm.) and
$K$=thermal conductivity (watts/cm./° C.)

The figure of merit (Z) as a function of temperature is shown graphically by the curve of this composition in FIG. 2 over a temperature range of approximately 100° C. to 600° C.

*Example II*

To prepare an n-type thermoelectric composition having the formula $Cd_{1.2}Sn_{0.8}As_2$, 13.44 grams of cadmium, 9.44 grams of tin, and 14.8 grams of arsenic, all highly purified, were admixed and charged into a quartz bulb one-half inch in diameter and 7 inches long. The bulb was evacuated and sealed off. The bulb was then lowered at a rate of 1 inch per hour through a 12 inch long top zone of a two zone vertical furnace. The top zone was at a temperature of 630° C. After passing through the top zone, the bulb was passed through a 12 inch long bottom zone of the furnace at a rate of 1 inch per hour. The bottom zone was at a temperature of 580° C. The compound was then allowed to cool slowly to room temperature.

The solid cast bar of $Cd_{1.2}Sn_{0.8}As_2$ had a diameter of one-half inch and a length of 3 inches.

A series of test wafers were out from the body and tested to determine the various properties of the material. The figure of merit (Z) was determined over a temperature range of approximately 100° C. to 600° C. using the equation:

$$Z=\frac{\alpha^2}{\rho K}$$

wherein the terms have the values set forth above.

The figure of merit (Z) as a function of temperature is shown graphically by the curve of this compositon in FIG. 2 over a temperature range of approximately 100° C. to 6000° C.

*Example III*

An n-type thermoelectric material having the composition $CdSnAs_2$ was prepared in accordance with the procedure of Example I using 11.2 grams cadmium, 11.8 grams tin, and 14.8 grams arsenic. The thermoelectric figure of merit Z was determined for this composition over a temperature range of approximately 100° C to 600° C and is set forth graphically in FIG. 2.

Equally suitable n-type thermoelectric materials may be prepared in accordance with the procedures of Examples I and II in which either zinc and/or mercury is substituted for all or part of the cadmium, while germanium and/or silicon is substituted for all or part of the tin, and antimony and/or phosphorus is substituted for all or part of the arsenic. These materials will be useful in thermoelectric power generators.

Thermoelectric pellets or elements may be prepared by cutting a cast bar, prepared as in the examples, to suitable length and cross-section, and affixing metal contacts to opposite ends of the elements. The metal contacts may comprise a layer of solder applied by ultrasonic means, a flame-sprayed coating of metal or a plasma-jet applied coating of a metal. Also the powdered composition may be placed in a mold with preformed metal caps at each end of a measured amount of the composition, and the assembly subjected to high pressure. The pressing can be carried out in a hot mold at from 500° C. to 600° C., or else a cold compressed pellet with contacts affixed at opposite ends can be sintered at temperatures of up to 600° C.

While the invention has been described with reference to particular embodiments and examples, it will be understood that modifications, substitutions and the like may be made therein without departing from the scope.

We claim as our invention.

1. A thermoelectric device comprising at least one thermoelectric element comprised at least in part of a chemically reacted composition having the formula $A_xB_{2-x}C_2$ wherein, A is at least one element selected from the group consisting of cadmium, zinc, and mercury; B is at least one element selected from the group consisting of tin, germanium, and silicon; and C is at least one element selected from the group consisting of arsenic, antimony, and phosphorus, and $x$ may vary from 0.5 to 1.5.

2. A thermoelectric device comprising at least one thermoelectric element comprised at least in part of a chemically reacted composition having the formula $$Cd_xSn_{2-x}As_2$$

wherein $x$ may vary from 0.5 to 1.5.

3. A thermoelectric device comprising at least one thermoelectric element comprised at least in part of a chemically reacted composition having the formula $$Cd_xSn_{(2-x)}As_2$$

where $x$ has a value of from 1 to 1.2.

4. A thermoelectric element comprised at least in part of a chemically reacted composition having the formula $Cd_xSn_{(2-x)})As_2$, where $x$ has a value of from 1 to 1.2.

5. A thermoelectric device comprising at least one thermoelectric element comprised at least in part of a chemically reacted composition having the formula $$Cd_{1.1}Sn_{.9}As_2$$

6. A chemically reacted composition suitable for use in thermoelectric devices having the formula $A_xB_{2-x}C_2$, wherein A is at least one element from the group consisting of cadmium, zinc and mercury, B is at least one element selected from the group consisting of tin, germanium and silicon, and C is at least one element selected from the group consisting of arsenic, antimony and phosphorus, and $x$ may vary from 0.5 to 1.5.

7. A thermoelectric pellet comprised of (1) a body of a chemically reacted composition, said composition having the formula $A_xB_{2-x}C_2$, wherein A is at least one element selected from the group consisting of cadmium, zinc and mercury, B is at least one element selected from the group consisting of tin, germanium and silicon, C is at least one element selected from the group consisting of arsenic, antimony and phosphorus, and $x$ may vary from 0.5 to 1.5 and (2) metallic electrical contacts applied to opposite ends of said body.

References Cited in the file of this patent

UNITED STATES PATENTS

| | | |
|---|---|---|
| 2,793,243 | Lindenblad | May 21, 1957 |
| 2,886,618 | Goldsmid | May 12, 1959 |